(12) United States Patent
Balasubramanian et al.

(10) Patent No.: US 10,941,652 B2
(45) Date of Patent: Mar. 9, 2021

(54) SYSTEMS AND METHODS FOR TERAHERTZ MODULATION FOR TELEMETRY

(71) Applicant: HALLIBURTON ENERGY SERVICES, INC., Houston, TX (US)

(72) Inventors: Ramachandhran Balasubramanian, San Jose, CA (US); Neal Gregory Skinner, Lewisville, TX (US); John Laureto Maida, Houston, TX (US); Wolfgang Hartmut Nitsche, Humble, TX (US); Satyan Gopal Bhongale, Cypress, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 22 days.

(21) Appl. No.: 16/312,314

(22) PCT Filed: Sep. 16, 2016

(86) PCT No.: PCT/US2016/052224
§ 371 (c)(1),
(2) Date: Dec. 21, 2018

(87) PCT Pub. No.: WO2018/052441
PCT Pub. Date: Mar. 22, 2018

(65) Prior Publication Data
US 2019/0234203 A1      Aug. 1, 2019

(51) Int. Cl.
*E21B 47/13* (2012.01)
*H03C 7/00* (2006.01)
*E21B 47/18* (2012.01)
*H03C 7/02* (2006.01)

(52) U.S. Cl.
CPC .............. *E21B 47/13* (2020.05); *E21B 47/18* (2013.01); *H03C 7/00* (2013.01); *H03C 7/02* (2013.01)

(58) Field of Classification Search
CPC .......... E21B 47/122; E21B 47/18; H03C 7/02
See application file for complete search history.

(56) References Cited

U.S. PATENT DOCUMENTS

| 1,894,942 A | 1/1933 | Chromy |
| 4,872,744 A | 10/1989 | Abeles et al. |

(Continued)

FOREIGN PATENT DOCUMENTS

| WO | PCT/US2014/056360 A1 | 3/2015 |
| WO | PCT/US2015/039335 A1 | 1/2017 |

OTHER PUBLICATIONS

International Search Report and Written Opinion dated May 29, 2017 for international patent application No. PCT/US2016/052224, filed on Sep. 16, 2016.

(Continued)

*Primary Examiner* — Rufus C Point
(74) *Attorney, Agent, or Firm* — Chamberlain Hrdlicka

(57) ABSTRACT

Systems and methods for terahertz modulation in a terahertz frequency band from about 0.1 terahertz to about 10 terahertz propagating in a wellbore intersecting a subterranean earth formation. A transmitter generates the EM radiation in the terahertz frequency band. A modulator located in the wellbore receives the EM radiation and generates an amplitude modulated signal with the EM radiation.

24 Claims, 12 Drawing Sheets

(56) References Cited

U.S. PATENT DOCUMENTS

| | | | | |
|---|---|---|---|---|
| 5,757,832 | A * | 5/1998 | Uchida | B82Y 20/00 372/106 |
| 6,278,541 | B1 | 8/2001 | Baker | |
| 9,303,507 | B2 * | 4/2016 | Black | E21B 47/12 |
| 9,983,331 | B2 * | 5/2018 | Nitsche | G02B 6/262 |
| 10,222,468 | B2 * | 3/2019 | Assefzadeh | E21B 47/002 |
| 10,359,302 | B2 * | 7/2019 | Hartog | G01H 9/004 |
| 10,364,673 | B1 * | 7/2019 | Bhongale | E21B 47/053 |
| 2003/0035205 | A1 * | 2/2003 | Zisk, Jr. | H04B 10/2916 359/341.3 |
| 2005/0149169 | A1 * | 7/2005 | Wang | A61L 31/18 623/1.15 |
| 2005/0157365 | A1 | 7/2005 | Ravnkilde et al. | |
| 2007/0040469 | A1 * | 2/2007 | Yacoubian | H04N 5/30 310/311 |
| 2008/0149819 | A1 * | 6/2008 | Zhdaneev | G01N 33/2823 250/255 |
| 2009/0262766 | A1 | 10/2009 | Chen et al. | |
| 2009/0296086 | A1 * | 12/2009 | Appel | E21B 49/10 356/326 |
| 2010/0252738 | A1 * | 10/2010 | Kasai | G01N 21/3586 250/339.07 |
| 2010/0282959 | A1 * | 11/2010 | Dong | G01V 8/02 250/269.1 |
| 2010/0301971 | A1 * | 12/2010 | Yonak | H01P 7/082 333/219.1 |
| 2013/0328693 | A1 * | 12/2013 | Mohamadi | E21B 47/13 340/854.6 |
| 2014/0210634 | A1 * | 7/2014 | Black | E21B 17/1085 340/854.6 |
| 2015/0086152 | A1 | 3/2015 | Samson et al. | |
| 2015/0338718 | A1 | 11/2015 | Zhang et al. | |
| 2016/0265339 | A1 * | 9/2016 | Xia | H01B 7/046 |
| 2016/0282504 | A1 * | 9/2016 | Wilson | E21B 47/01 |
| 2019/0234203 | A1 * | 8/2019 | Balasubramanian | H03C 7/02 |

OTHER PUBLICATIONS

Acuna 2010, Far Field and Near Field Terahertz Spectroscopy on Parabolic Quantum Wells (PhD Thesis).

Chen 2009, Terahertz Metamaterials.

Chowdhury 2014, Ultrafast Switching on Terahertz Metamaterials Using Ion Implanted Silicon on Sapphire.

Fitch 2004, Terahertz Waves for Communications and Sensing.

Gao 2014, High-Contrast Terahertz Modulation by Gated Grapheme Enhances by Extraordinary Transmission Through Ring Apertures.

Klein-Ostmann 2004, Room-Temperature Operation of an Electrically Driven THz Modulator.

Rahm 2016, THz Wave Modulators: A Brief Review on Different Modulation Techniques.

Soma 2003, Propagation Measurements and Modeling of LMDS Radio Channel in Singapore.

Tao 2008, A Metamaterial Absorber for the Terahertz Regime: Design, Fabrication and Characterization.

* cited by examiner

SYSTEMS AND METHODS FOR TERAHERTZ MODULATION FOR TELEMETRY

CONTEXT

This section is intended to provide relevant contextual information to facilitate a better understanding of the various aspects of the described embodiments. Accordingly, it should be understood that these statements are to be read in this light and not as admissions of prior art.

Petroleum drilling, evaluation, and production operations demand a great quantity of information relating to parameters and conditions downhole. Such information may include characteristics of earth formations traversed by a wellbore, along with data relating to the size and configuration of the wellbore itself. The collection of information relating to conditions downhole is referred to as "logging."

Logging may be done during the drilling process, eliminating the necessity of removing or "tripping" the drilling assembly to insert a wireline logging tool to collect the data. Data collection during drilling also allows the driller to make accurate modifications or corrections as needed to optimize performance while minimizing down time. Designs for measuring conditions downhole including the movement and location of the drilling assembly contemporaneously with the drilling of the wellbore have come to be known as "measurement-while-drilling" techniques, or "MWD." Similar techniques, concentrating more on the measurement of formation parameters, commonly have been referred to as "logging-while-drilling" techniques, or "LWD". While distinctions between MWD and LWD may exist, the terms MWD and LWD often are used interchangeably.

When oil wells or other wellbores are being drilled, it may be necessary or desirable to determine the direction and inclination of the drill bit and downhole motor so that the assembly can be steered in the correct direction. Additionally, information may be required concerning the nature of the strata being drilled, such as the formation's resistivity, porosity, density and its measure of gamma radiation. It is also frequently desirable to know other downhole parameters, such as the temperature and the pressure at the base of the wellbore, for example. Once this data is gathered at the bottom of the wellbore, it is typically transmitted to the surface for use and analysis by the driller.

Sensors or transducers typically are located at the lower end of the drill string in LWD systems. While drilling is in progress these sensors continuously or intermittently monitor drilling parameters and formation data and transmit the information to a surface detector by some form of telemetry. The downhole sensors employed in LWD applications may be positioned in a cylindrical drill collar that is positioned close to the drill bit. The LWD system then employs a system of telemetry in which the data acquired by the sensors is transmitted to a receiver located on the surface.

There are a number of telemetry systems that seek to transmit information regarding downhole parameters up to the surface without requiring the use of a wireline tool. These include acoustic telemetry systems that transmit signals through the drilling fluid or drill string. Fiber optic telemetry systems transmit signals through a fiber optic cable running along the drill string. However, in drilling applications, a fiber optic coupler is required at each interconnecting drill pipe along the drill string. This requires accurate alignment between interconnecting fiber optic cables along the drill string. Further, this greatly reduces the transmission length of telemetry signals since each fiber optic coupler attenuates the fiber optic signal. Additionally, each fiber optic coupler increases the cost of the telemetry system. Terahertz modulation downhole can offer a more robust electromagnetic telemetry system as further described herein.

DESCRIPTION OF THE DRAWINGS

For a detailed description of the embodiments, reference will now be made to the accompanying drawings in which.

DETAILED DESCRIPTION

This disclosure provides systems and methods for modulating electromagnetic radiation in a terahertz frequency band for use in a telemetry system. As used herein, the terahertz frequency band includes a frequency range from about 0.1 terahertz to about 10 terahertz. As described herein, about 0.1 terahertz refers to ±10% of 0.1 terahertz, and about 10 terahertz refers to ±10% of 10 terahertz.

Figure 1:
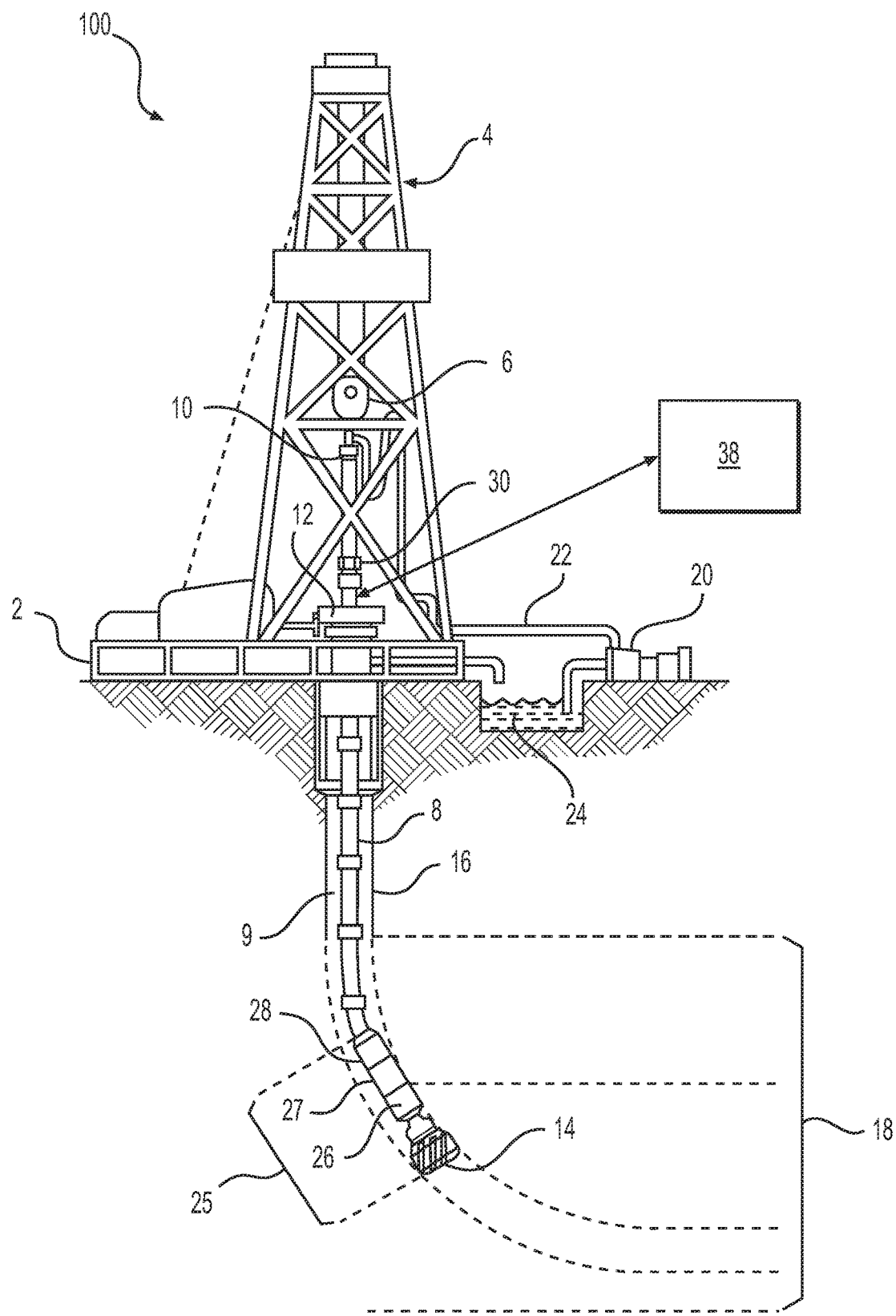
FIG. 1 shows a schematic view of a drilling operation, according to one or more embodiments.

FIG. 1 shows a schematic view of a drilling operation employing a terahertz telemetry system 100, according to one or more embodiments. As shown, a drilling platform 2 supports a derrick 4 having a traveling block 6 for raising and lowering a drill string 8. A drill string kelly 10 supports the rest of the drill string 8 as it is lowered through a rotary table 12. The rotary table 12 rotates the drill string 8, thereby turning a drill bit 14. As the drill bit 14 rotates, it creates a wellbore 16 that passes through various subterranean earth formations 18. A pump 20 circulates drilling fluid through a feed pipe 22 to the kelly 10, downhole through the interior of the drill string 8, through orifices in the drill bit 14, back to the surface via an annulus 9 around the drill string 8, and into a retention pit 24. The drilling fluid transports cuttings from the wellbore 16 into the pit 24 and aids in maintaining the integrity of the wellbore 16.

A bottomhole assembly 25 is connected along the drill string 8 and includes drill collars 26, a logging tool 27, and the drill bit 14. Drill collars 26 are thick-walled steel pipe sections that provide weight and rigidity for the drilling process. The logging tool 27 (which may be built into one of the drill collars) may collect measurements relating to various wellbore and formation properties as well as the position of the bit 14 and various other drilling conditions as the bit 14 extends the wellbore 16 through the formations 18. The logging tool 27 may include a device for measuring formation resistivity, a gamma ray device for measuring formation gamma ray intensity, devices for measuring the inclination and azimuth of the tool string 8, pressure sensors for measuring drilling fluid pressure, temperature sensors for measuring wellbore temperature, etc.

The bottomhole assembly 25 may also include a telemetry module 28 that receives data provided by the various sensors of the bottomhole assembly 25 (e.g., sensors of logging tool 27), and transmits the data to a surface control unit 38. Data may also be provided by the surface control unit 38, received by the telemetry module 28, and transmitted to the tools (e.g., logging tool 27) of the bottomhole assembly 25. The telemetry module 28 includes a terahertz modulator that is configured to modulate an electromagnetic (EM) wave in a terahertz frequency band as will be described in further detail below. It should be appreciated that the telemetry module 28 employing the terahertz modulator, in accordance with one or more embodiments, may be used in various downhole applications, such as wireline, slickline, coiled tubing, MWD, LWD, production tubing, and the like.

Figure 2:
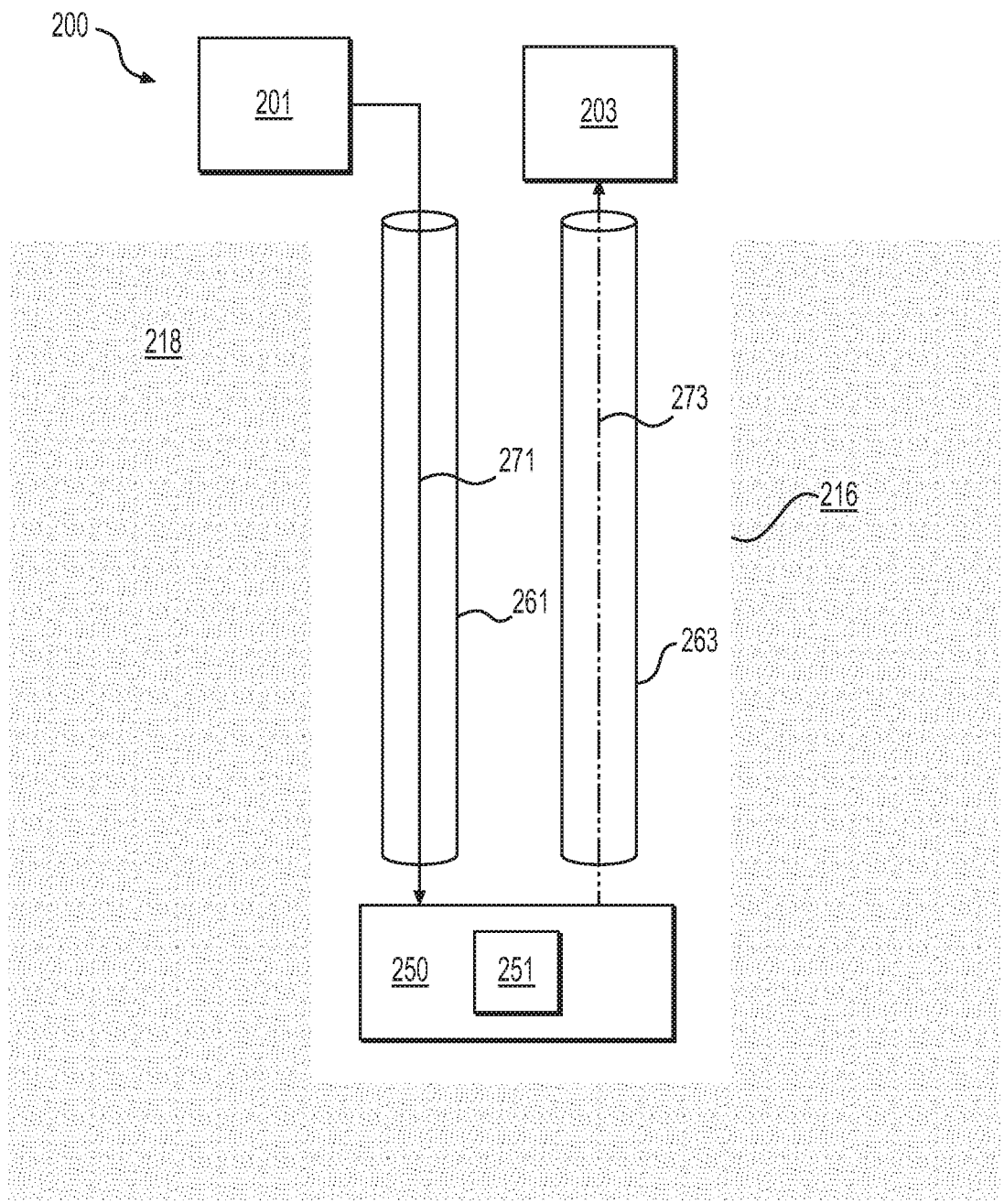
FIG. 2 shows a schematic view of a telemetry system employing a terahertz modulator in a wellbore, according to one or more embodiments.

FIG. 2 shows a schematic view of a telemetry system 200 employing a terahertz modulator 250 locatable in a wellbore 216 intersecting a subterranean earth formation 218, in accordance with one or more embodiments. As shown, a transmitter 201 is in communication with the terahertz modulator 250 via an EM waveguide 261 in communication between the transmitter 201 and the terahertz modulator 250. The transmitter 201 generates EM radiation 271 in the terahertz frequency band and emits it into the EM waveguide 261. The transmitter 201 can include any suitable energy source of EM radiation in the terahertz frequency band including, but not limited to, an optically pumped laser, high electron mobility transistors, Stark ladders, varactors, varistors, Schottky and Gunn diode chains, beat-frequency-down-converted dual lasers (optical photomixing), vertical cavity surface emitting lasers, quantum cascade diode lasers, free electron lasers, and the like. The transmitter 201 can be located at the surface or in the wellbore 216.

The terahertz modulator 250 receives the EM radiation 271 in the wellbore 216, modulates the EM radiation 271 to create a modulated signal 273, and transmits the modulated signal 273 in the terahertz frequency band through a second EM waveguide 263. The terahertz modulator 250 can include a modulation device 251 that amplitude modulates the EM radiation 271 converting it to the modulated signal 273. It should be appreciated that the terahertz modulator 250 may be included in a telemetry module (e.g., the telemetry module 28 of FIG. 1) locatable in a wellbore 216.

The second EM waveguide 263 is in communication between a receiver 203 and the terahertz modulator 250. The receiver 203 is in communication with the terahertz modulator 250 via the second EM waveguide 263 and receives the modulated signal 273. The transmitter 201 and receiver 203 may be locatable at the surface and integrated with a surface control unit (e.g., the surface control unit 38 of FIG. 1). The transmitter 201 and/or the receiver 203 can be located in the wellbore 216.

The EM waveguides 261, 263 include any suitable mechanism used to guide EM energy in the terahertz frequency band from one location (e.g., the surface) to another (e.g., the wellbore location of the modulator 250). For example, the EM waveguides 261, 263 may have a uniform cross-section, e.g., a circular or rectangular cross-section, and may include a conductive material, such as copper or a copper alloy. The EM waveguides 261, 263 may be a string of interconnected conductive pipes or tubulars integrated with and/or attached to a drill string (e.g., the drill string 8 of FIG. 1), coiled tubing, slickline, production string, and the like. The EM waveguides 261, 263 may also have different configurations, cross-sections, or conductive materials. The EM waveguides 261, 263 may be hollow or filled with any suitable dielectric material.

Figure 3:
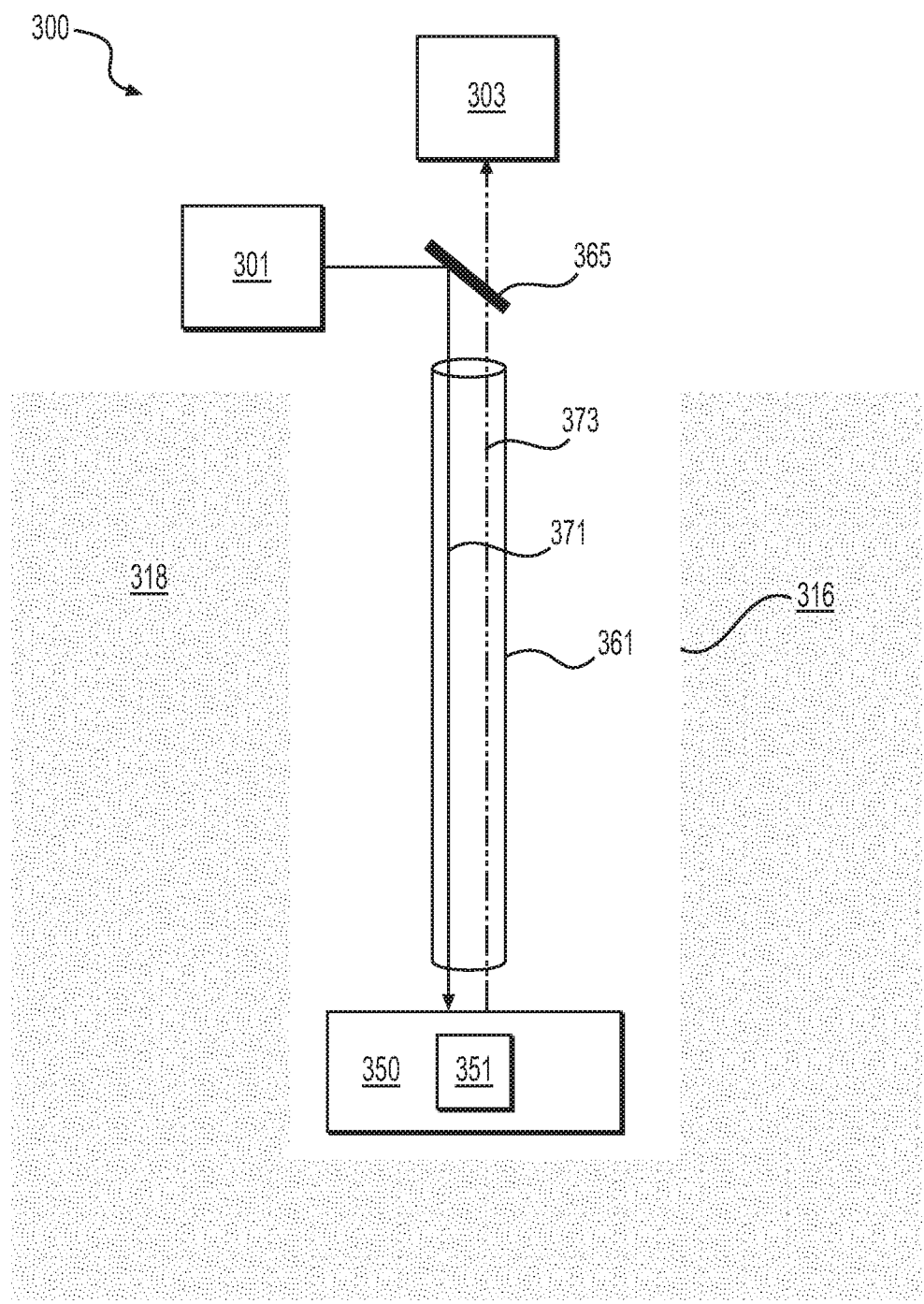
FIG. 3 shows a schematic view of a telemetry system employing terahertz modulation in a wellbore, according to one or more embodiments.

FIG. 3 shows a schematic view of another telemetry system 300 employing a terahertz modulator 350 with a waveguide 361 in a wellbore 316 intersecting a subterranean earth formation 318, in accordance with one or more embodiments. The transmitter 301 transmits the EM radiation 371 through a beam splitter 365 that directs a reflection of the EM radiation 371 into the EM waveguide 361. The beam splitter 365 can produce a 50/50 split of the EM radiation 371. The terahertz modulator 350 receives the EM radiation 371 and generates a modulated signal 373 using the modulation device 351. The modulated signal 373 is emitted into the waveguide 361 and received by the receiver 303. Thus, a single waveguide 361 can be used as a communication path between the transmitter 301 and the modulator 350 as well as between the modulator 350 and the receiver 303. However, if terahertz radiation is propagating along the waveguide 361 with the same carrier frequency (e.g., 0.4 THz), some radiation can suffer from scattering (e.g., at a misaligned connection between waveguide pipes along the drill string) along the waveguide 361 and interfere with the modulated signal 373 received at the receiver 303. To counteract interference from scattering, the modulator 350 may use a modulation scheme that reduces the effect of strong background noise.

As a non-limiting example, the modulator 350 may use a multi-tone modulation scheme, e.g., dual-tone modulation. To achieve a data rate of 1 kb/s, the modulation device 351 may amplitude modulate the EM radiation 371 for 1 µs with a 1.0 MHz sinusoidal signal to send a "0" bit, and modulate at 1.3 MHz for 1 µs to send a "1" bit. At the surface, the receiver 303 includes two lock-in amplifiers with one lock-in amplifier set to 1.0 MHz and the other set to 1.3 MHz. If the 1.0 MHz lock-in amplifier detects a stronger signal than the 1.3 MHz lock-in amplifier, this means a "0" bit is received; otherwise a "1" bit is received. It should be appreciated that this dual-tone modulation scheme is exemplary and a similar approach could also be done at other suitable data rates with more than two tones. Further, other suitable modulation schemes could be employed to reduce the sensitivity of the receiver 303 to background noise.

Figure 4:
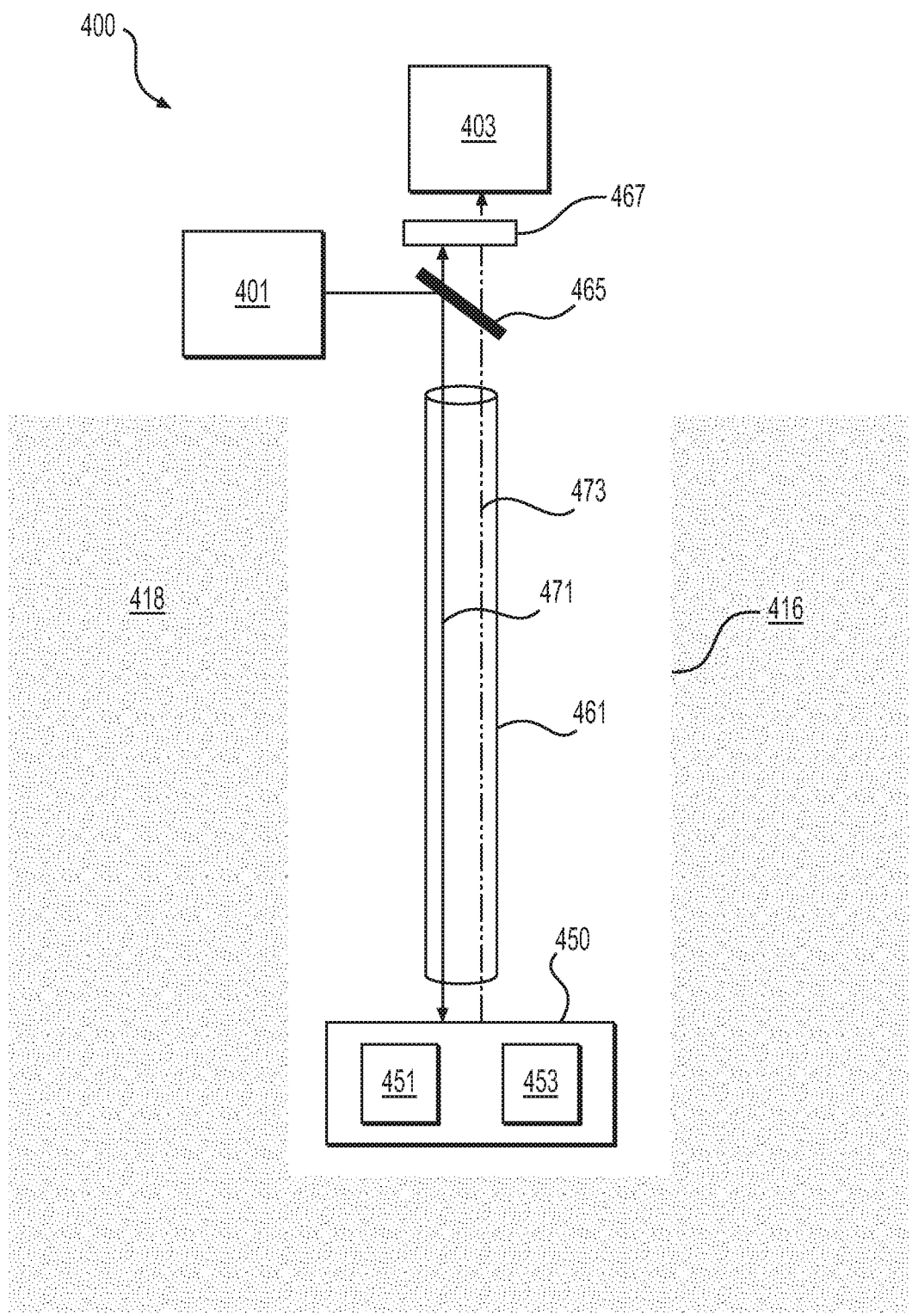
FIG. 4 shows a schematic view of a telemetry system employing terahertz modulation in a wellbore, according to one or more embodiments.

FIG. 4 shows a schematic view of a telemetry system 400 with a terahertz modulator 450 used in a wellbore 416 intersecting a subterranean earth formation 418, in accordance with one or more embodiments. The transmitter 401 transmits the EM radiation 471 into the beam splitter 465, which directs a reflection of the EM radiation 471 into the EM waveguide 473. The beam splitter 465 can produce a 50/50 split of the EM radiation 471. The modulator 450 can include a modulation device 451 to amplitude modulate the EM radiation 471 and a frequency multiplier 453 (e.g., a frequency doubler) to generate a harmonic of the carrier frequency of the EM radiation 471. For example, the modulation device 451 receives the EM radiation 471 at a carrier frequency of 0.4 THz, amplitude modulates it, and transmits the modulated signal 473 to the frequency multiplier 453 at the carrier frequency (0.4 THz), which generates a harmonic of the modulated signal, e.g., 0.8 THz. The modulated signal 473 travels through the EM waveguide 461, the beam splitter 465, and a band-pass filter 467 configured to allow the second carrier frequency (e.g., 0.8 THz) of the frequency multiplier 453 to pass and attenuates the first carrier frequency (0.4 THz). In one or more embodiments, the frequency multiplier 453 may receive the EM radiation 471 before the device 451 and afterwards the device 451 generates the modulated signal 473 at the second carrier frequency.

Figure 5:
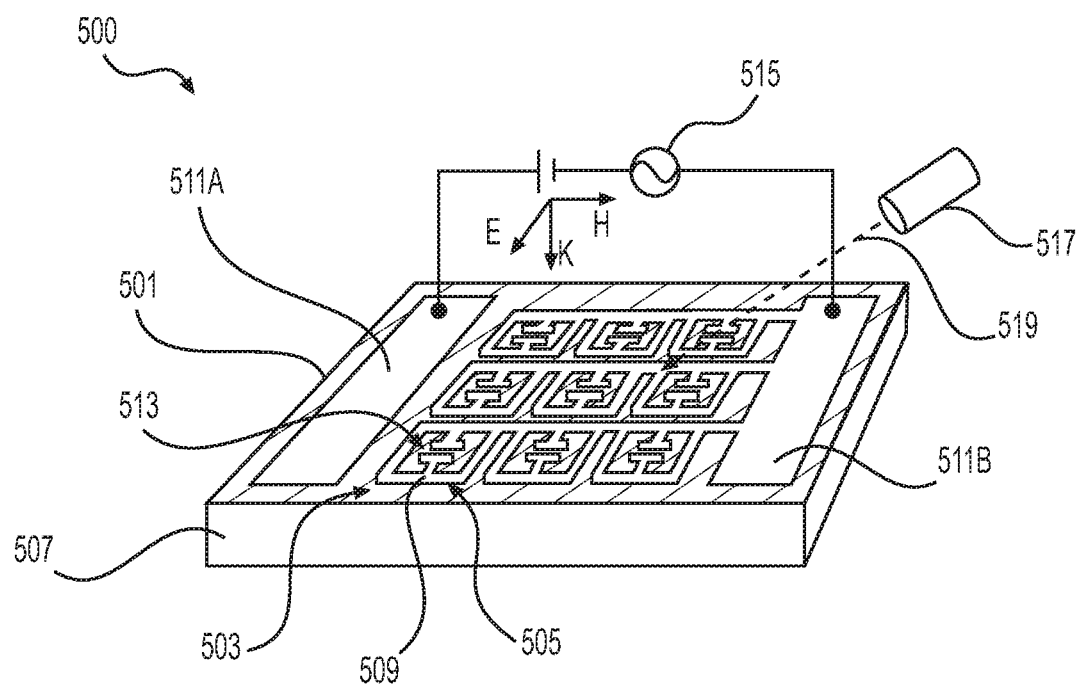
FIG. 5 shows an axonometric view of a modulation device including a metamaterial, according to one or more embodiments.

In one or more embodiments, the modulation devices 251, 351, 451 of FIGS. 2-4 include a metamaterial to amplitude modulate the terahertz radiation transmitted through the EM waveguides as further described herein. For example, FIG. 5 shows an axonometric view of a modulation device 500 including a metamaterial 501 used to amplitude modulate EM radiation in the terahertz frequency band, in accordance with one or more embodiments. As shown, the modulation device 500 can also include a power supply 515 and/or a light source 517 (such as a laser) to modulate EM radiation using the metamaterial 501 as further described herein. The metamaterial 501 includes an array 503 of resonators 505 formed across a substrate material 507. The metamaterial 501 is operated to modulate EM radiation by transmitting or reflecting EM radiation at a resonant frequency in the terahertz frequency band. The metamaterial 501 operates essentially as a band-pass filter at this resonant frequency when EM radiation is incident to the metamaterial 501. As illustrated, the metamaterial 501 is radiated by normally incident EM radiation (e.g., from the EM radiation 271 of FIG. 2) as depicted by axes E, H, and k. The axis k represents the normally incident direction of propagation of the EM radiation relative to the metamaterial 501, while the axes E and H represent the orientation of polarization of the electric and magnetic fields, respectively. As a transmitting modulation device, the metamaterial 501 allows the incident EM radiation at the resonant frequency to pass through it and into an EM waveguide (e.g., the EM waveguide 261). In contrast, as a reflective modulation device, the metamaterial reflects the incident EM radiation at the resonant frequency directing the reflection into an EM waveguide (e.g., the EM waveguide 261).

Each resonator 505 includes a conductive material 509 layered in a split-ring resonator pattern on the substrate material 507, which may include a semiconductor material, such as GaAs. The resonant frequency of the metamaterial 505 depends in part on the split-ring resonator pattern of the conductive material 509 applied to the resonators 505. Further, this split-ring resonator pattern can also determine the reflected and/or transmission power of the metamaterial 501 in response to the incident radiation as further described herein.

Figure 6:
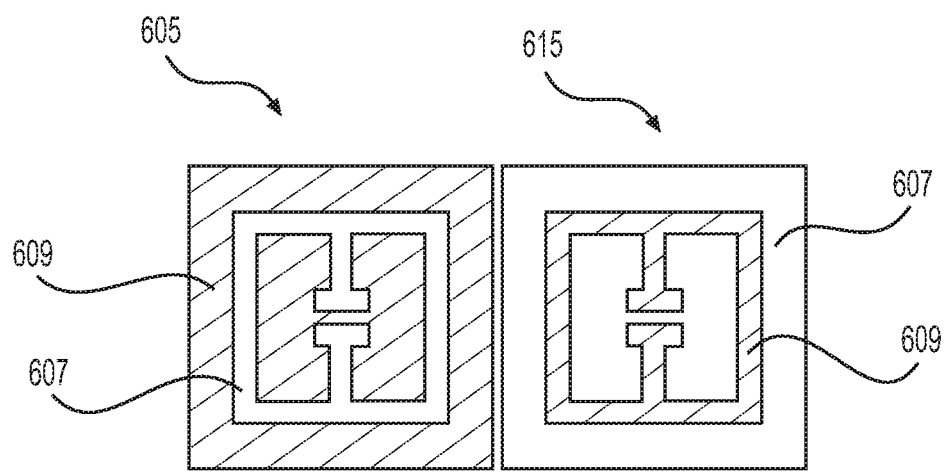
FIG. 6 shows a schematic view of resonators, according to one or more embodiments.

FIG. 6 shows a schematic view of resonators 605 and 615, in accordance with one or more embodiments. The resonator 605 includes a conductive material 607 layered in a split-ring resonator pattern on the substrate material 609, while the resonator 615 has the conductive material 607 layered in a complementary fashion on the substrate material 609. As further described herein, the resonator 605 can operate as a band-stop filter at the resonant frequency by attenuating incident EM radiation, while the resonator 615 can operate as a band-pass filter at the resonant frequency by reflecting incident EM radiation. It should be appreciated that the conductive material 607 may be layered on the substrate material 609 using any suitable split-ring resonator pattern.

Figure 7:
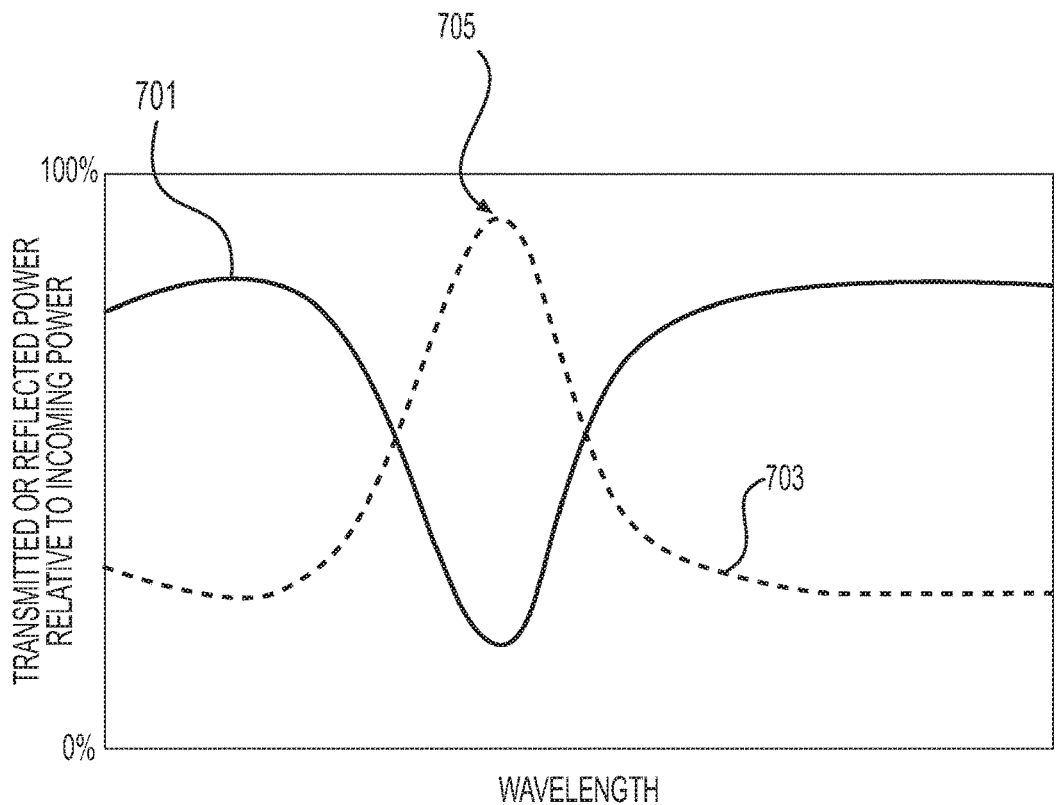
FIG. 7 shows a graph view of the transmitted and reflected amplitude spectra of a metamaterial used as a terahertz modulator, according to one or more embodiments.

FIG. 7 shows a graph of power curves 701 and 703 as a function of wavelength, in accordance with one or more embodiments. The power curve 701 depicts the transmission power of the resonator 605 and the reflection power of the resonator 615 at the resonant frequency 705 in response to incident EM radiation. In contrast, the power curve 703 depicts the reflection power of the resonator 605 and the transmission power of the resonator 615 at the resonant frequency 705. The power curves 701 and 703 demonstrate the complementary nature of the resonators 605 and 615 with respect to their band-pass parameters while operating as a reflector or a transmitter. For example, the resonator 605 can operate as band-stop filter at the resonant frequency 705 for EM radiation passing through resonator 605 by attenuating this radiation, but can operate as a band-pass filter at the resonant frequency 705 by reflecting incident EM radiation. Thus, it should be appreciated that the split-ring resonator pattern can be selected to determine the band-pass parameters of the metamaterial 501 when operating as a reflector or a transmitter.

The resonant frequency of the metamaterial 501 can be adjusted by changing the charge carrier density in the substrate material 507. The power supply 515 can be connected to electrical contacts 511A and B (such as an Ohmic contact and a Schottky contact, respectively) on the metamaterial 501 and the power supply 515 can vary the bias voltage applied to these contacts 511A and B to adjust the charge carrier density in the substrate material 507. The light source 517 may include a laser to emit pulses of light 519 onto the metamaterial 501 to photoexcite electrons in the metamaterial 501 and adjust the charge carrier density in the substrate material 507. By adjusting the charge carrier density, the band-pass parameters of the metamaterial 501 can change allowing it to amplitude modulate incident EM radiation.

Figure 8:
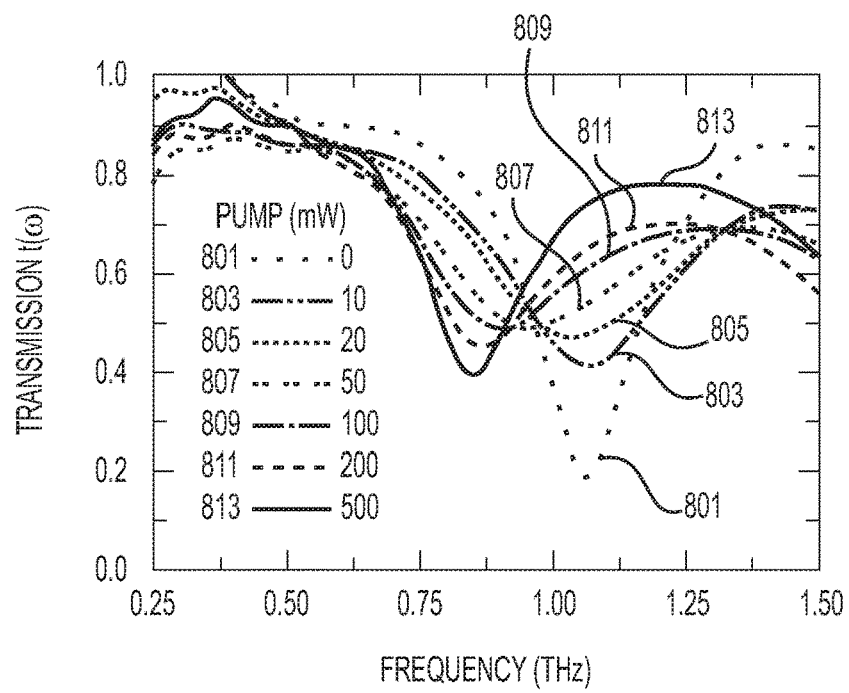
FIG. 8 shows a graph view of the transmission amplitude spectra of a metamaterial by adjusting a charge carrier density, according to one or more embodiments.

FIG. 8 shows a graph view of transmission amplitude spectra of the metamaterial 501, according to one or more embodiments. As shown, the curves 801-813 depict the transmission power of the metamaterial 501 as varying power levels of light 519 are radiated onto the metamaterial 501 using the light source 517 to photoexcite the charge carrier density in the substrate material 507. This photoexcitation can be performed before the terahertz radiation arrives at the metamaterial 501 with a pulse of light 519 emitted from the light source 517. The curves 801-813 demonstrate that the metamaterial 501 can amplitude modulate the incident EM radiation by adjusting the charge carrier density in the substrate material 507.

Each resonator 505 may include a diode 513 formed from the substrate material 507 and the conductive material 509 to control the amplitude modulation. The transmission power at the resonant frequency of the metamaterial 501 can be adjusted by applying a reverse bias voltage with the power supply 515 to the diode 513 in each resonator 505.

Figure 9:
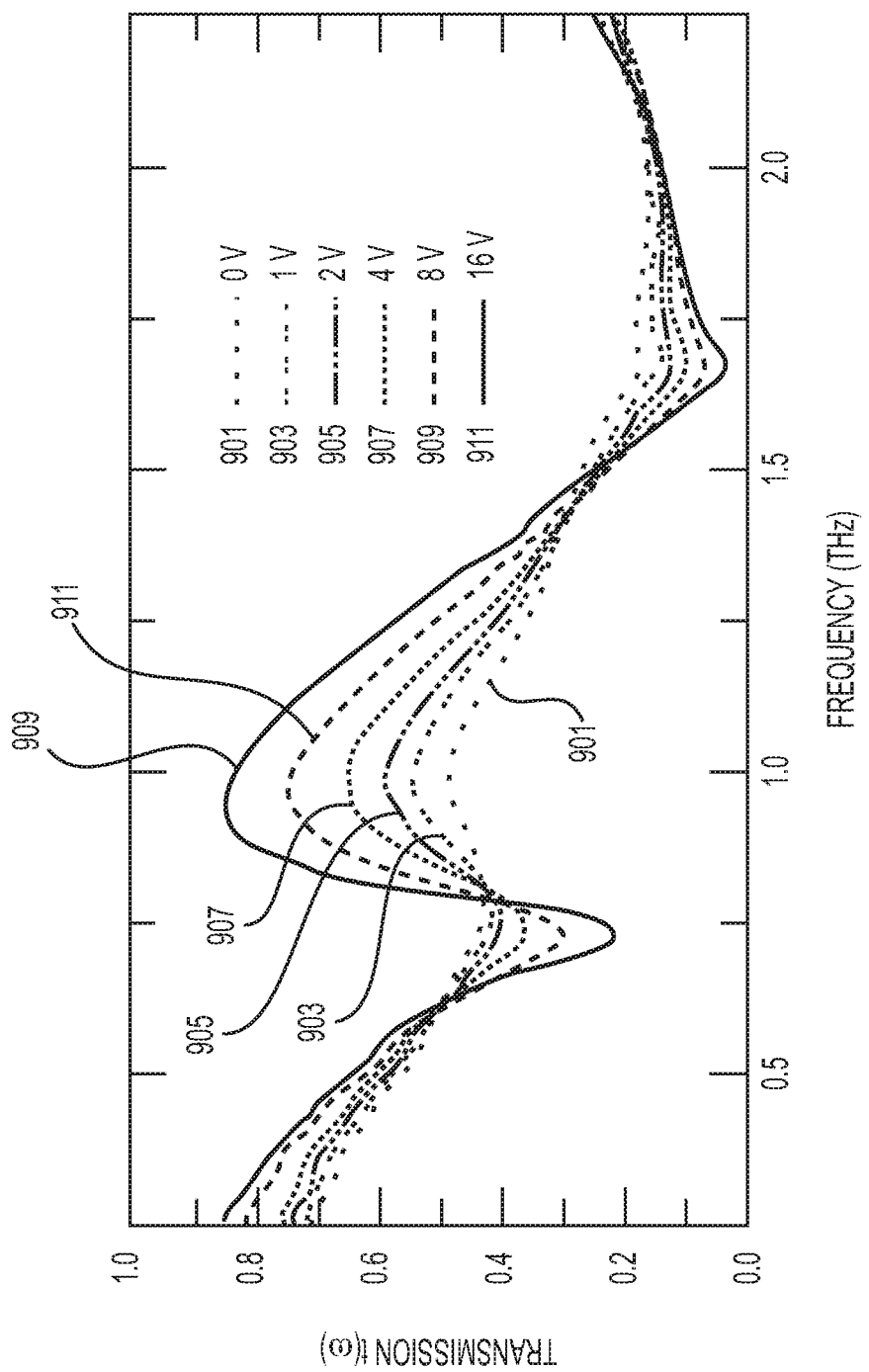
FIG. 9 shows a graph view of the amplitude spectra of the metamaterial with a diode as a function of a bias voltage applied to the metamaterial, according to one or more embodiments.

FIG. 9 shows a graph view of transmission amplitude spectra of the metamaterial 501, according to one or more embodiments. As shown, the curves 901-911 depict the transmission power of the metamaterial 501 as varying bias voltages are applied to the electrical contacts 511A and B to adjust the impedance produced by the diodes 513. The electrical contacts 511 can include an Ohmic contact and a Schottky contact to control the current flow of the bias voltage. Without a reverse bias voltage applied to the metamaterial 501, the substrate material 507 shorts the gap between the conductive material 509 in the split-ring resonator pattern of each resonator 505, and the metamaterial 501 fails to resonate as shown in curve 901. As the reverse bias voltage is increased, the diodes 513 increases the impedance between the gaps in the conductive material 509 allowing the metamaterial 501 to resonate and increase the transmission power of the metamaterial 501 as shown in curves 903-911. Thus, curves 901-911 demonstrate that the metamaterial 501 can amplitude modulate incident EM radiation by adjusting a bias voltage applied to the metamaterial 501, which in turn, changes the impedance produced by the diodes 513 included in the resonators 505 between the gaps in the conductive material 509.

Figure 10:
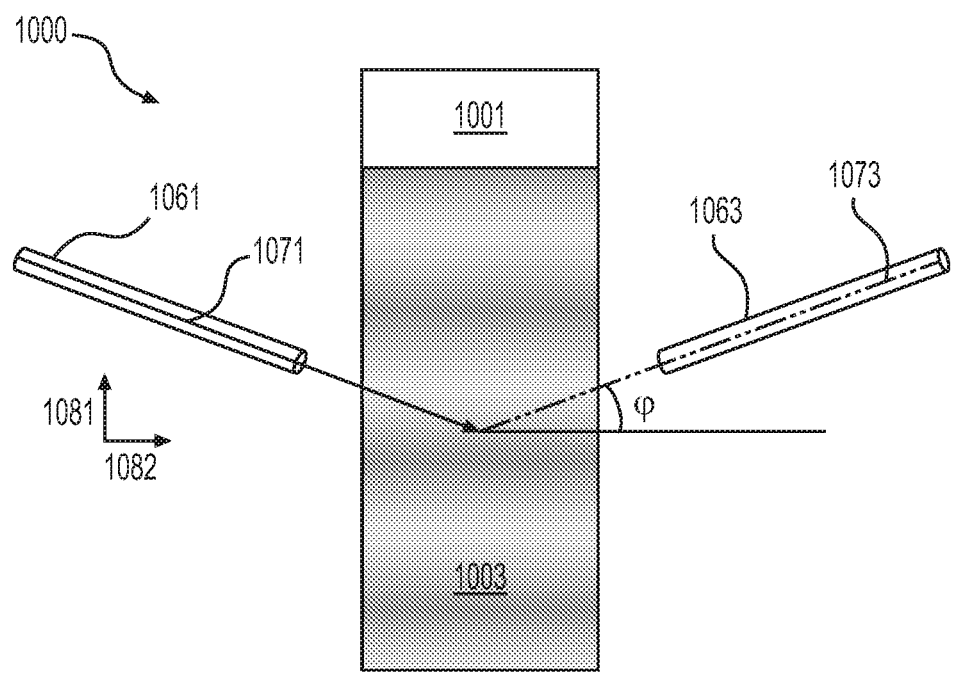
FIG. 10 shows a schematic view of a terahertz modulator employing a transducer coupled to a diffraction material, according to one or more embodiments.

In one or more embodiments, the modulation devices 251, 351, 451 of FIGS. 2-4 include a transducer coupled to a diffraction material to amplitude modulate terahertz radiation incident to the diffraction material as further described herein. For example, FIG. 10 shows a schematic view of a modulation device 1000 including a transducer 1001 coupled to a diffraction material 1003, in accordance with one or more embodiments. As shown, the diffraction material 1003 is mechanically excited by the transducer 1001 such that an acoustic wave propagating in an axial direction (e.g., along a y-axis 1081) forms in the diffraction material 1003 and amplitude modulates incident terahertz radiation 1071 based on principles applied in acousto-optical modulation.

It should be appreciated that the transducer 1001 can include a piezoelectric material, an electromagnetic acoustic transducer, etc. The diffraction material 1003 can include a crystal, a solid, or a fluid suitable for generating a standing wave and refracting EM terahertz radiation.

Figure 11:
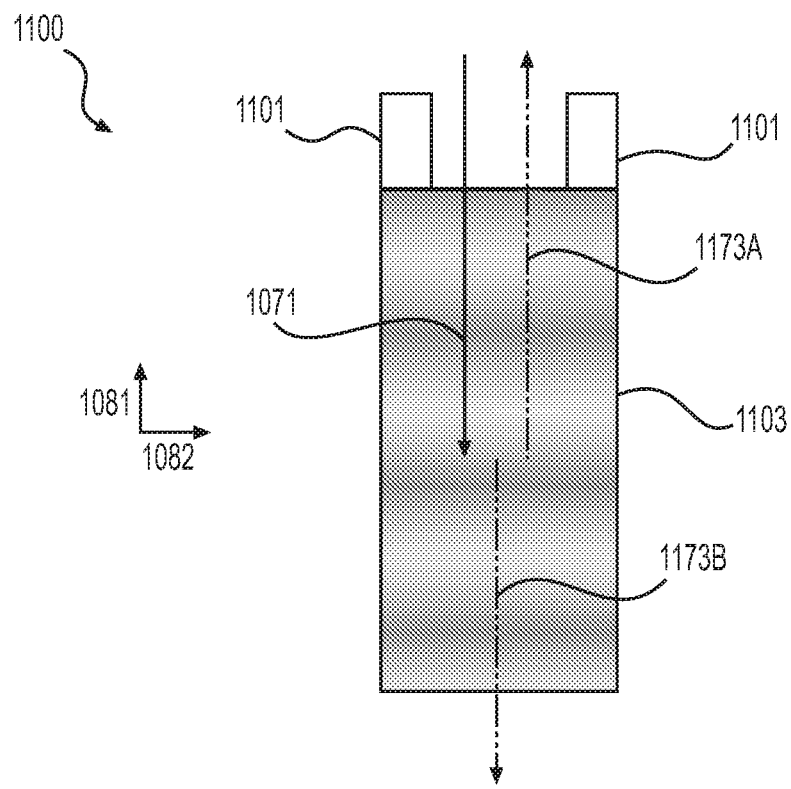
FIG. 11 shows a schematic view of another terahertz modulator employing a transducer coupled to a diffraction material, according to one or more embodiments.
Figure 12:
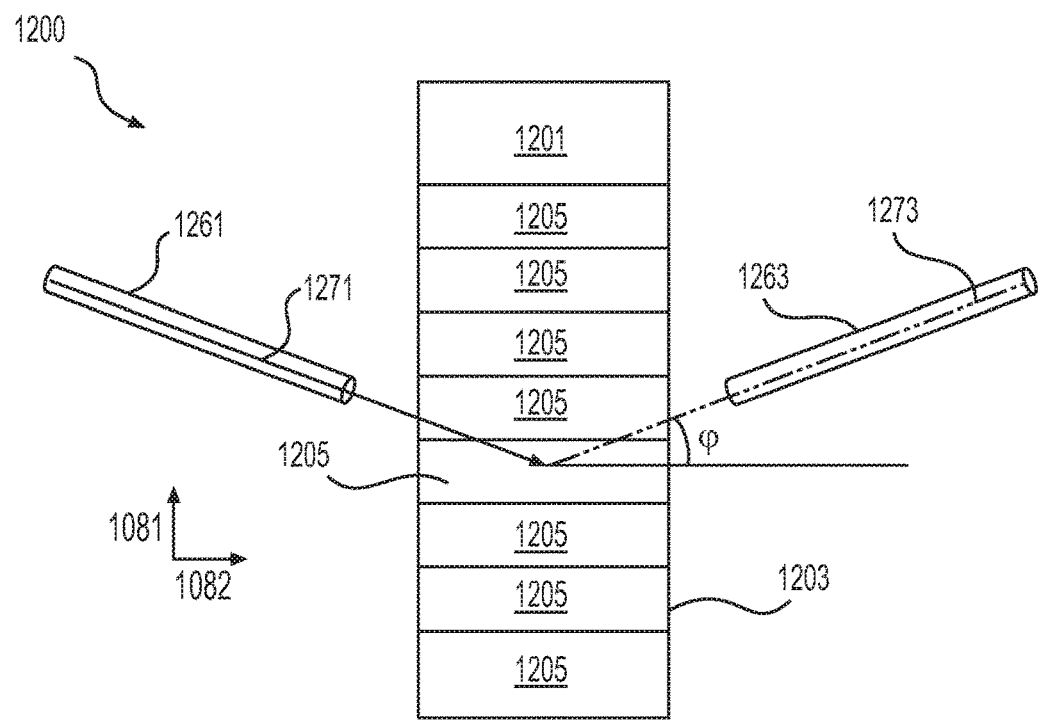
FIG. 12 shows a schematic view of another terahertz modulator employing a transducer coupled to layered diffraction materials, according to one or more embodiments.

Reference may be made to various directions or axes, such as a y-axis or direction 1081, and an x-axis or direction 1082, as represented schematically on FIGS. 10-12. It should be appreciated that these axes are in relation to the orientation of the diffraction material and not set axes.

The acoustic wave may form a standing wave in the diffraction material 1003 and produce shifting indexes of refraction in the diffraction material 1003. A waveguide 1061 directs EM radiation 1071 into the diffraction material 1003. The standing wave allows the diffraction material 1003 to operate similar to an adjustable Bragg-mirror, and the diffraction material 1003 refracts the incident terahertz radiation by a refraction angle φ with respect to normal of the diffraction material 1003. The refraction angle φ in part depends on the frequency and amplitude of the standing wave generated in the diffraction material 1003. A second EM waveguide 1063 may be positioned at a certain angle (e.g., the angle φ) relative to the diffraction material 1003 to receive the refracted EM radiation to produce a modulated signal 1073. Thus, only some of the terahertz radiation that leaves the diffraction material 1003 at a specific angle is directed into the second waveguide 1063. This demonstrates that by changing the frequency and/or amplitude of the standing wave with the transducer 1001 the incident terahertz radiation can be amplitude modulated to produce a modulated signal 1073.

FIG. 11 shows a schematic view of a modulation device 1100 including transducers 1101 coupled to a diffraction material 1103 to generate modulated signals 1173A, 1173B, in accordance with one or more embodiments. As shown, EM radiation 1071 is directed into the diffraction material 1103 relative to the direction of propagation of the acoustic wave produced in the diffraction material 1173 by the transducers 1101. The diffraction material 1103 reflects part of the EM radiation back as a modulated signal 1173A and/or attenuates part of the EM radiation as the modulated signal 1173B. The percentage of the radiation which is reflected back or attenuates through the diffraction material 1103 depends in part on the amplitude and/or frequency of the acoustic wave in the diffraction material 1103. This demonstrates that the attenuated or reflected THz radiation from the diffraction material 1103 can serve as amplitude modulated signals 1173A, 1173B.

FIG. 12 shows a schematic view of a modulation device 1200 including a transducer 1201 coupled to a layered diffraction material 1203, in accordance with one or more embodiments. As shown, the diffraction material 1203 operates in a similar fashion as an adjustable Bragg mirror and includes stacked layers of compressible materials 1205 with varying indexes of refraction. As the transducer 1201 compresses or applies tension in an axial direction, such as along the y-axis 1081, to the diffraction material 1203, the periodicity of this Bragg mirror changes, which in turn, adjusts the refraction angle φ, allowing the modulation device 1200 to amplitude modulate the incident EM radiation 1271.

Figure 13:
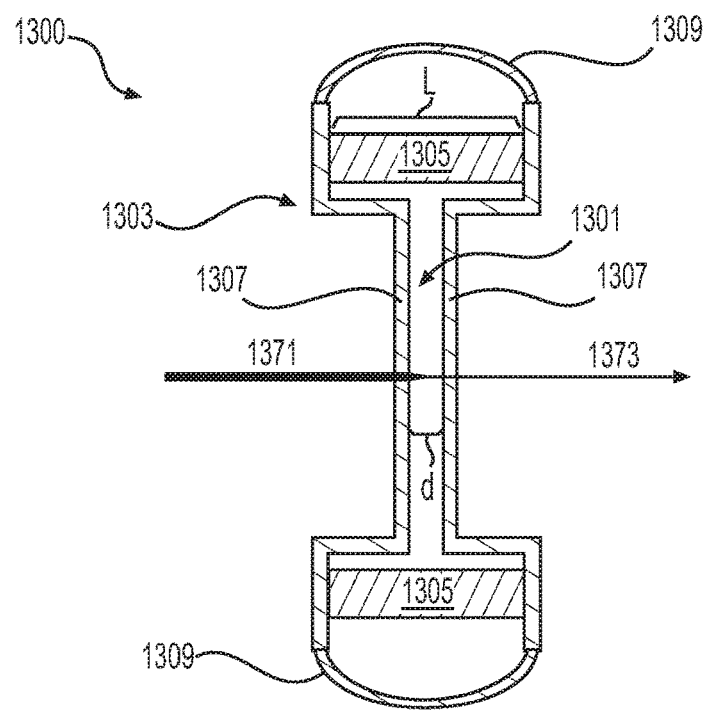
FIG. 13 shows a schematic view of a terahertz modulator employing an absorptive material, according to one or more embodiments.

In one or more embodiments, the modulation devices 251, 351, 451 of FIGS. 2-4 include a transducer coupled to a chamber with an absorptive material to amplitude modulate terahertz radiation incident to the absorptive material as further described herein. For example, FIG. 13 shows a schematic view of a modulation device 1300 that amplitude modulates EM radiation by directing the radiation through an absorptive material 1301 with a variable thickness d, in accordance with one or more embodiments. As shown, EM radiation 1371 is emitted through a chamber 1303 filled with the absorptive material 1301, which absorbs or attenuates the EM radiation traveling through the chamber 1303 to produce a modulated signal 1373 as further described herein.

Transducers 1305 are coupled to the chamber 1303 to vary the thickness d of the absorptive material 1301 in the chamber 1303 that receives the EM radiation 1371. For example, the transducers 1305 may increase or decrease in length L, and as the thickness d of the absorptive material 1301 changes, the power of the radiation traveling through the absorptive material 1301 changes. If the length L of the transducers 1305 change by $\Delta L$, the thickness d of the absorptive material 1301 changes by $\Delta d = \Delta L$. The power of the modulated signal 1373 is proportional to $P_0 \exp(-\alpha \, \Delta d)$ where $P_0$ is the power of the EM radiation 1371 incident to the chamber 1303 reduced by the power absorbed by windows 1307 (i.e., $P_0$ is the power of the modulated signal 1373 if the thickness d is zero, which takes into account the losses caused by the windows 1307) and a is the attenuation coefficient of the absorptive material 1301. Therefore, the power of the modulated signal 1373 can be modulated by varying the thickness d of the absorptive material 1301 using the transducers 1305.

The absorptive material 1301 may include any suitable material that can absorb and/or attenuate EM radiation in the terahertz frequency band traveling through the absorptive material 1301, such as water. The chamber 1303 may be formed in part by windows 1307 that includes a material transparent to EM terahertz radiation, such as polytetrafluoroethylene (PTFE) or sapphire, and allows incident EM radiation to pass through the window 1307 across the absorptive material 1301. Flexible membranes 1309 may be coupled to the chamber 1303 to allow the chamber 1303 to expand or contract with the axial expansion or contraction of the transducers 1305, e.g., ΔL. It should be appreciated that the illustrated modulation device 1300 is an exemplary modulator, and the modulation device 1300 can take any suitable form to modulate incident EM radiation by varying the thickness of the absorptive material 1301.

Figure 14:
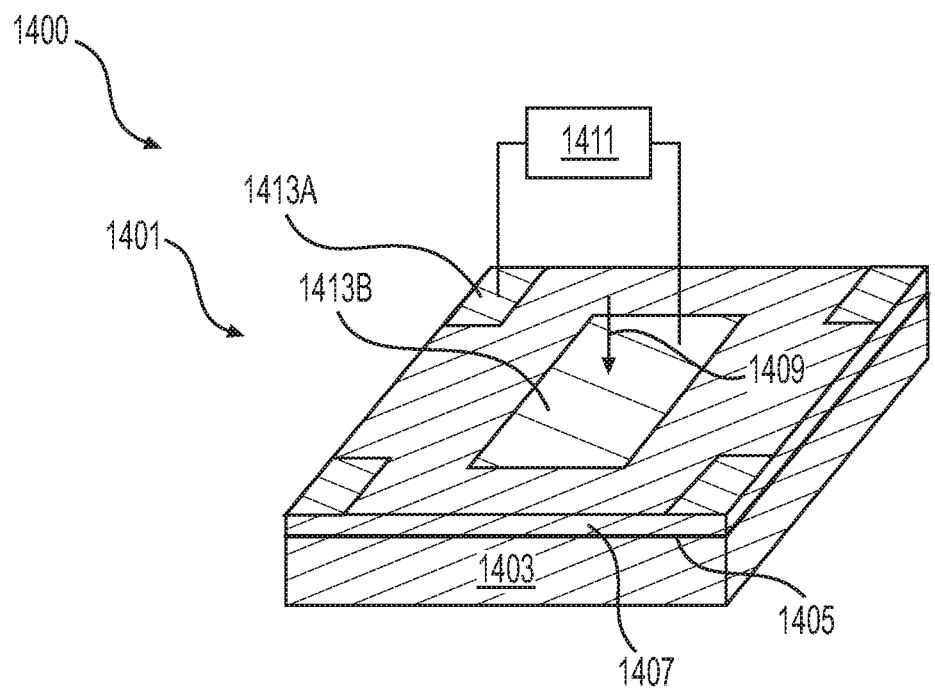
FIG. 14 shows a schematic view of a terahertz modulator employing a semiconductor heterojunction with a quantum well, according to one or more embodiments.

In one or more embodiments, the modulation devices 251, 351, 451 of FIGS. 2-4 include a semiconductor with a quantum well to modulate terahertz radiation as further described herein. For example, FIG. 14 shows a modulation device 1400 including a semiconductor 1401 with a quantum well, in accordance with one or more embodiments. As shown, the semiconductor 1401 includes a substrate layer 1403, a quantum well layer 1405, and a cap layer 1407. The modulation device 1400 can modulate incident EM radiation by reflecting the EM radiation from or transmitting the EM radiation through the semiconductor 1401 with a quantum well. Terahertz radiation 1409 is directed onto the semiconductor 1401 in a direction of incidence perpendicular to the plane of the quantum well in the quantum well layer 1405. Thus, the electric field direction of the incident radiation 1409 is aligned with the plane of the quantum well, and the incident radiation 1409 can accelerate charge carriers within the quantum well layer 1405. The power of the radiation that is reflected or transmitted depends in part on the density of charge carriers in the quantum well layer 1405, and this density can be controlled by adjusting a bias voltage applied to the semiconductor 1401 with a power supply 1411. Therefore, by changing the bias voltage, the intensity of the reflected or transmitted terahertz radiation can be amplitude modulated.

The substrate layer 1403 can include an intrinsic gallium arsenide wafer. A quantum well can be formed in the quantum well layer 1405 with a semiconductor heterojunction, such as gallium arsenide (GaAs) surrounded by or layered on aluminum gallium arsenide ($Al_xGa_{1-x}As$). It should be appreciated that the quantum well layer 1405 can include one or more semiconductor heterojunctions. The cap layer 1407 can include a semiconductor such as gallium arsenide (GaAs) to prevent the corrosion of the quantum well layer 1405. An Ohmic contact 1413A can be located on the cap layer 1407 such that the Ohmic contact 1413A connects to the quantum well layer 1405. For example, a conductive material, such as a conductive metal, can form the Ohmic contact 1413A by thermally diffusing the conductive material through the cap layer 1407 until the conductive material contacts the quantum well layer 1405. Also, a Schottky contact 1413B can be formed on the cap layer 1407 by evaporating a conductive material, such as a conductive metal, on the cap layer 1407. The Schottky contact 1413B may have a thickness so that the EM radiation incident to the Schottky contact 1413B can travel through the Schottky contact 1413B. The power supply 1411 (e.g., a DC voltage source) can be connected to the contacts 1413A and B to apply a bias voltage to the Schottky contact 1413B relative to the Ohmic contact 1413A. For example, applying a negative bias voltage to the Schottky contact 1413B depletes the electrons in the quantum well layer 1405, and thus, reduces the contribution of the quantum well to the incident EM radiation 1409. With no bias voltage applied to the electrical contacts 1413A and B, the quantum well is filled with electrons and can contribute to the incident EM radiation 1409. Thus, by adjusting the bias voltage applied to the contacts 1413A and B, the semiconductor 1401 can be used as an electrically controlled modulator.

In one or more embodiments, a parabolic quantum well can be formed in the quantum well layer 1405 by selecting a suitable fraction x in the aluminum gallium arsenide ($Al_xGa_{1-x}As$) in the semiconductor heterojunction. A parabolic quantum well has a resonant frequency and the parabolic quantum well can be excited by an electric field emitted in the direction (e.g., the direction 1409) perpendicular to the plane of the parabolic quantum well. Thus, the semiconductor 1401 with a parabolic quantum well can operate as an adjustable band-pass filter to amplitude modulate the incident terahertz radiation 1409. For example, the resonance frequency can be set to 1 THz by changing the width of the parabolic quantum well layer 1405. The density of charge carriers can again be controlled by applying a bias voltage to the semiconductor 1401, which in turn, can modulate the intensity of the terahertz radiation reflected or transmitted when the frequency of the terahertz radiation matches the resonant frequency of the parabolic quantum well.

However, if the radiation 1409 is emitted on the semiconductor 1401 in a direction of incidence perpendicular to the plane of the parabolic quantum well, the direction of the electric field is in general aligned with the plane of the parabolic quantum well. As a result, the resonance cannot be excited and the semiconductor 1401 cannot operate as a band-pass filter, since this requires an electric field component perpendicular to the plane of the parabolic quantum well.

Figure 15:
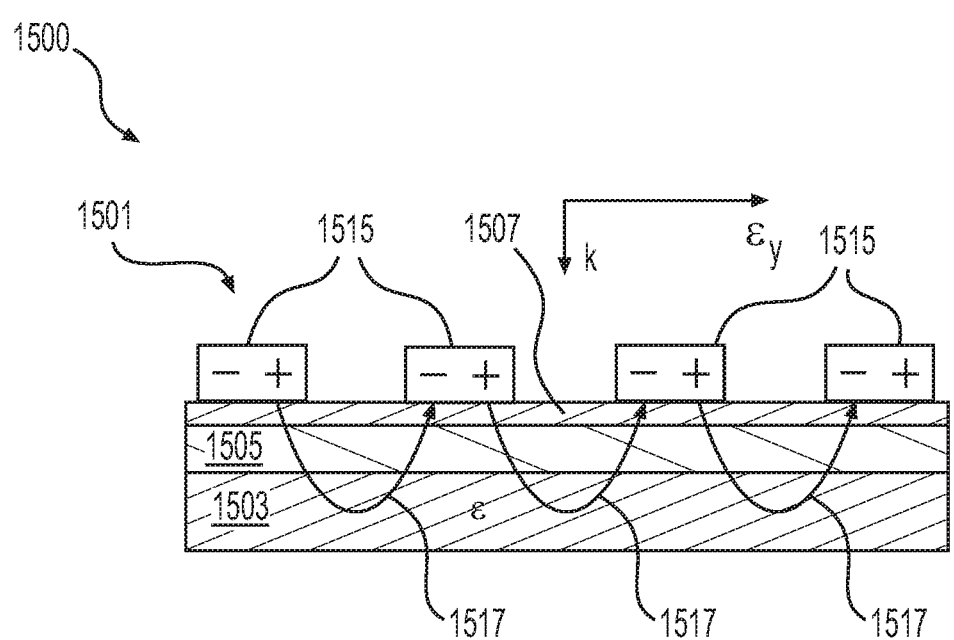
FIG. 15 shows a schematic view of another terahertz modulator employing a semiconductor heterojunction with a quantum well, according to one or more embodiments.

FIG. 15 shows a cross-section view of a modulation device 1500 including a semiconductor 1501 with conductive fingers 1515 used to produce an electric field component perpendicular to the plane of a parabolic quantum well, in accordance with one or more embodiments. The incident radiation is emitted in a direction indicated by the axis k with an electric field component polarized in the direction indicated by $\varepsilon_y$. The incident radiation induces a charge distribution within the conductive fingers 1515 and the induced charge distribution produces an electric field 1517, which has a component perpendicular to the plane of the parabolic quantum well. Thus, it should be appreciated that the intensity of the reflected or transmitted incident radiation at a frequency that matches the resonant frequency of the parabolic quantum well can be modulated by changing the bias voltage applied from a power supply (e.g., the power supply 1411 of FIG. 14) connected to the semiconductor 1501.

Figure 16:
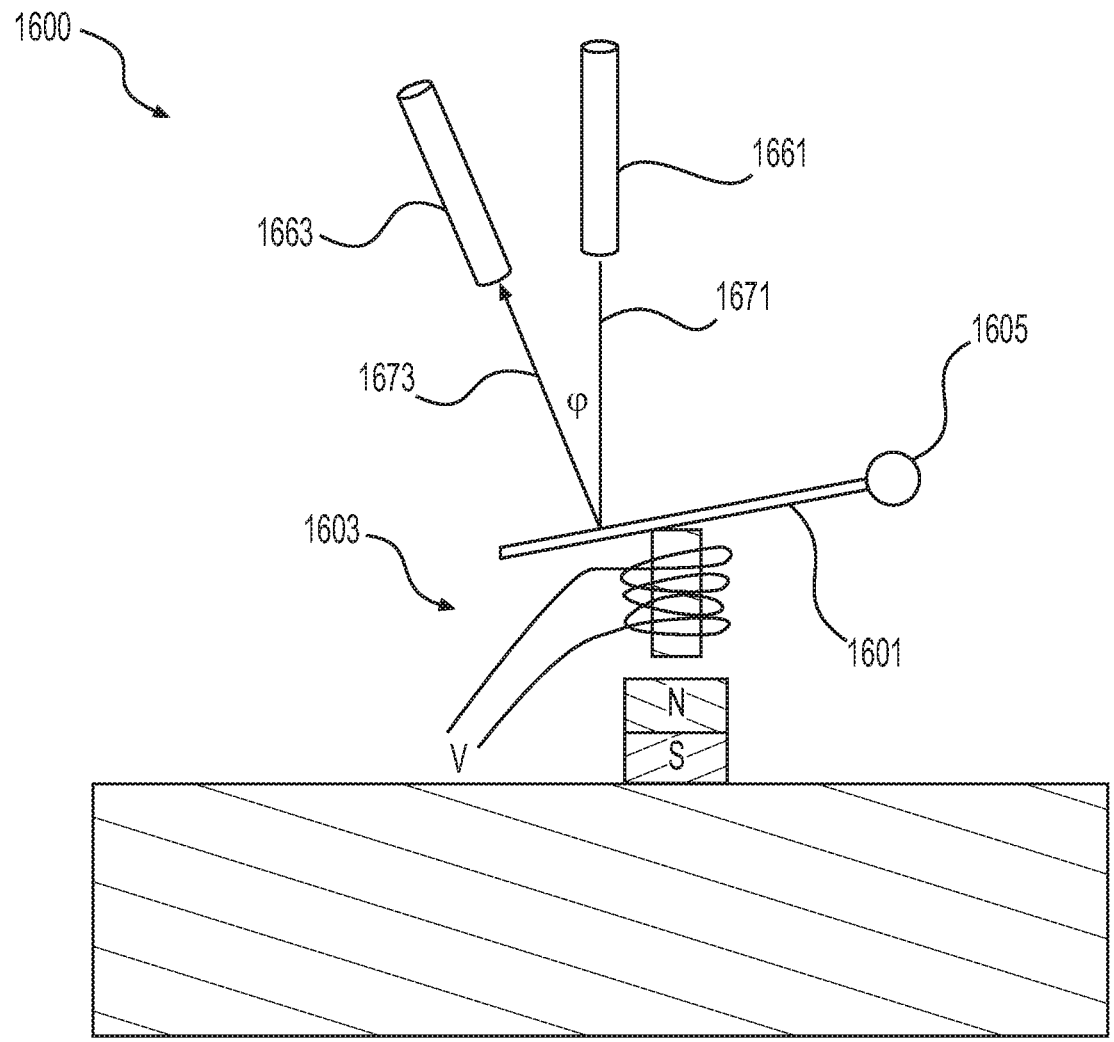
FIG. 16 shows a schematic view of a terahertz modulator employing a transducer coupled to a reflective element, according to one or more embodiments.

In one or more embodiments, the modulation devices 251, 351, 451 of FIGS. 2-4 include a transducer coupled to a reflective element to modulate EM terahertz radiation as further described herein. For example, FIG. 16 shows a schematic view of a modulation device 1600 that reflects incident terahertz radiation 1671 to amplitude modulate it, in accordance with one or more embodiments. The EM radiation 1671 is emitted from a waveguide 1661, arrives at the reflective element 1601, and reflects at an angle φ relative to the incident radiation 1671. A second waveguide 1663 is positioned at a specific angle (e.g., the angle φ) relative to the reflective element 1601 to receive the reflected EM radiation (e.g., a modulated signal 1673). The reflective element 1601 pivots on a hinge 1605 based on the azimuthal displacement applied by a transducer 1603, which determines the angle of reflection φ produced by the reflective element 1601. Thus, the incident radiation can be amplitude modulated into a modulated signal 1673 by adjusting the angle of reflection φ with the transducer 1603.

The reflective element 1601 includes any suitable material that can reflect EM radiation in the terahertz frequency band, such as a mirror or a deformable mirror. With a deformable mirror, the transducer 1603 may deform the reflective element 1601 like a diaphragm or flexible membrane without pivoting the reflective element 1601 on the hinge 1605. The transducer 1603 can include a piezoelectric material, an electromagnetic acoustic transducer, or the like. It should be appreciated that the reflected radiation, and in turn the modulated signal 1673, may be directed into the waveguide 1661 rather than the waveguide 1663 to transmit a modulated signal through the waveguide 1661, such as telemetry systems 300 and 400.

Figure 17:
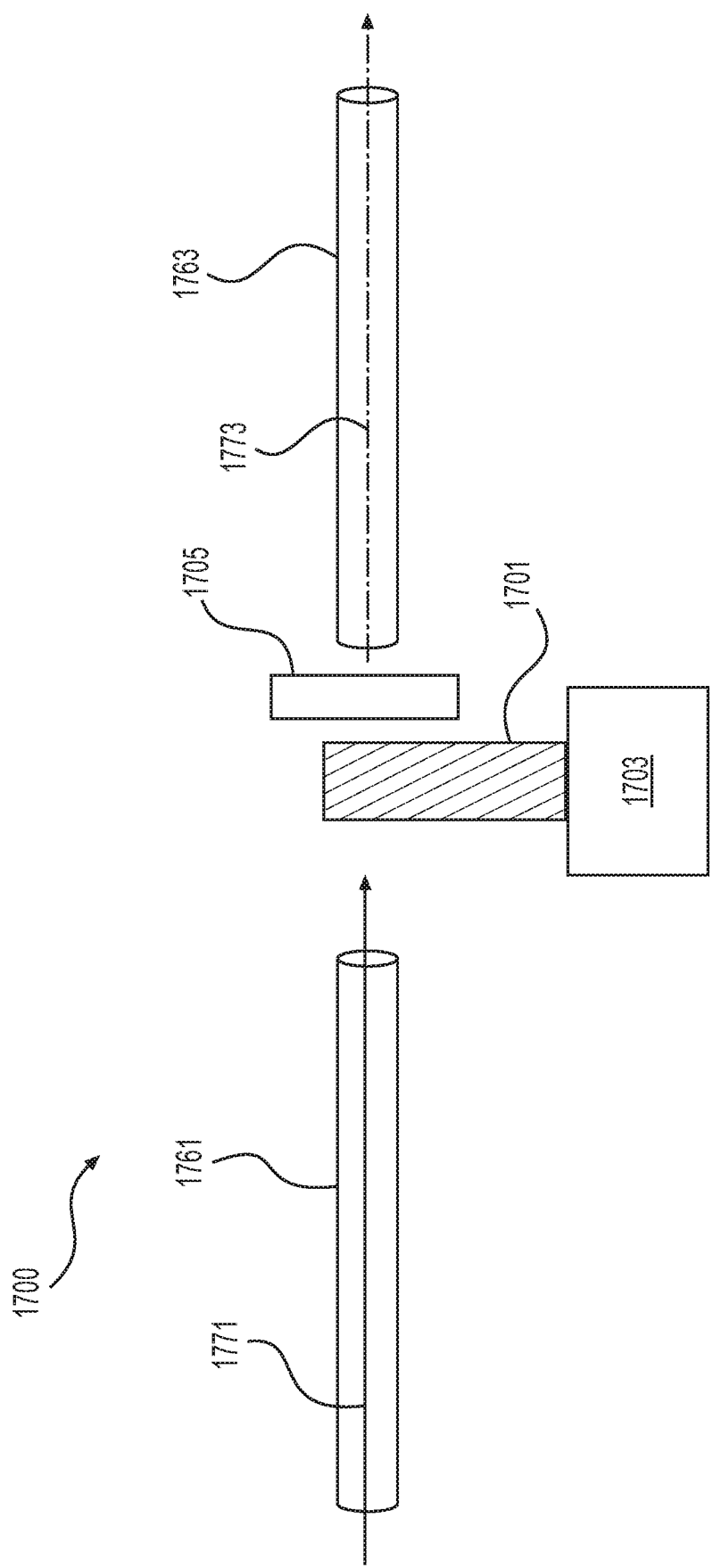
FIG. 17 shows a schematic view of a terahertz modulator employing a transducer coupled to a shutter, according to one or more embodiments.

In one or more embodiments, the modulation devices 251, 351, 451 of FIGS. 2-4 include a transducer coupled to a shutter to modulate EM terahertz radiation as further described herein. For example, FIG. 17 shows a schematic view of a modulation device 1700 that uses a shutter 1701 to interrupt a radiation path of EM radiation 1771 to amplitude modulate EM radiation in the terahertz frequency band, in accordance with one or more embodiments. As the EM radiation 1771 is emitted from a waveguide 1761, the shutter 1701 is axially displaced by a transducer 1703 coupled to the shutter 1701 to interrupt the radiation path of the EM radiation 1771. By interrupting the radiation path, the EM radiation 1771 can be amplitude modulated into a modulated signal 1773 and received by a second waveguide 1763.

It should be appreciated that the shutter 1701 can include a reflective element to reflect the radiation back into the waveguide 1761 to produce a modulated signal in that waveguide. Additionally, or alternatively, a reflective element 1705 can be placed behind the shutter 1701 such that the shutter 1701 can be positioned between the reflective element 1705 and the waveguide 1761 such that the modulated signal 1763 reflects into the waveguide 1761.

In addition to the embodiments described above, many examples of specific combinations are within the scope of the disclosure, some of which are detailed below:

Example 1

A system for modulating electromagnetic (EM) radiation in a terahertz frequency band from about 0.1 terahertz to about 10 terahertz propagating in a wellbore intersecting a subterranean earth formation, comprising:
  a transmitter configured to generate the EM radiation in the terahertz frequency band; and
  a modulator in communication with the transmitter, locatable in the wellbore, and configured to receive the EM radiation and generate an amplitude modulated signal with the EM radiation.

Example 2

The system of example 1, further comprising a waveguide in communication with the transmitter and the modulator and configured to propagate the EM radiation from the transmitter.

Example 3

The system of example 1, wherein the modulator comprises a metamaterial configured to receive the EM radiation and comprising:
  a substrate material; and
  a conductive material configured in a split-ring resonator pattern on the substrate material with a resonant frequency in the terahertz frequency band.

Example 4

The system of example 3, wherein the metamaterial is configured to amplitude modulate the electromagnetic radiation in the terahertz frequency band by adjusting a charge carrier density in the substrate material.

Example 5

The system of example 3, wherein the metamaterial includes a diode formed from the substrate material and the conductive material, and the metamaterial is configured to amplitude modulate the electromagnetic radiation by changing a bias voltage applied to the diode.

Example 6

The system of example 1, wherein the modulator comprises a semiconductor with a quantum well configured to amplitude modulate the electromagnetic radiation by adjusting a bias voltage applied to the semiconductor to change a charge carrier density in the quantum well.

Example 7

The system of example 1, wherein the modulator comprises:
  a diffraction material configured to receive the electromagnetic radiation; and
  a transducer coupled to the diffraction material and configured to generate an acoustic wave in the diffraction material such that the acoustic wave produces shifting indexes of refraction in the diffraction material to control a refraction angle with respect to the received EM radiation.

Example 8

The system of example 7, wherein the diffraction material comprises at least one of a crystal, a solid, and a fluid.

Example 9

The system of example 1, wherein the modulator comprises:
  a diffraction material configured to receive the electromagnetic radiation and comprising layers of compressible materials with varying indices of refraction; and a transducer coupled to the diffraction material and configured to compress or apply tension to the diffraction material to control a refraction angle with respect to the EM radiation received.

Example 10

The system of example 1, wherein the modulator comprises:
a chamber configured to receive the EM radiation;
an absorptive material in the chamber and configured to absorb electromagnetic radiation in the terahertz frequency band; and
a transducer coupled to the chamber and configured to vary the thickness of the absorptive material in the chamber to amplitude modulate the EM radiation received.

Example 11

The system of example 1, wherein the modulator comprises:
a reflective element configured to reflect the EM radiation; and
a transducer coupled to the reflective element and configured to adjust an angle of reflection produced by the reflective element when the EM radiation is incident to the reflective element to amplitude modulate the EM radiation.

Example 12

The system of example 1, wherein the modulator comprises:
a shutter;
a radiation path in communication with the transmitter for receiving the EM radiation; and
a transducer coupled to the shutter and configured to axially displace the shutter to interrupt at least part of the EM radiation received along the radiation path such that axially displacement amplitude modulates the EM radiation.

Example 13

The system of example 2, further comprising a bottom-hole assembly including the modulator, wherein the bottom-hole assembly is locatable in the wellbore via a drill string including the waveguide.

Example 14

The system of example 2, wherein the modulator is configured to transmit the signal with the EM radiation through the waveguide.

Example 15

The system of example 2, wherein the modulator is configured to reflect the signal with the EM radiation through the waveguide.

Example 16

The system of example 2, further comprising:
a receiver in communication with the modulator;
a second waveguide in communication with the receiver and the modulator; and
wherein the waveguide is configured to communicate the EM radiation to the modulator and the second waveguide is configured to communicate the modulated signal from the modulator to the receiver.

Example 17

A method for modulating electromagnetic radiation in a terahertz frequency band from about 0.1 terahertz to about 10 terahertz in a wellbore intersecting a subterranean formation, comprising:
transmitting the electromagnetic radiation in the terahertz frequency band through a waveguide using a transmitter; and
amplitude modulating the electromagnetic radiation using a modulator located in the wellbore.

Example 18

The method of example 17, wherein amplitude modulating comprises receiving the EM radiation on a metamaterial, wherein the metamaterial comprises a substrate material and a conductive material configures in a split-ring resonator pattern on the substrate material with a resonant frequency in the terahertz frequency band.

Example 19

The method of example 18, where amplitude modulating further comprises adjusting a charge carrier density in the substrate material.

Example 20

The method of example 18, wherein amplitude modulating further comprises changing a bias voltage applied to a diode formed from the substrate material and the conductive material.

Example 21

The method of example 17, wherein amplitude modulating comprises:
receiving the EM radiation on a semiconductor with a quantum well; and
adjusting a bias voltage applied to the semiconductor to change a charge carrier density in the quantum well.

Example 22

The method of example 17, wherein amplitude modulating comprises:
receiving the EM radiation on a diffraction material;
generating an acoustic wave in the diffraction material using a transducer such that the acoustic wave produces shifting indexes of refraction in the diffraction material to control a refraction angle with respect to the received EM radiation.

Example 23

The method of example 17, wherein amplitude modulating comprises:

receiving the EM radiation on a diffraction material comprising layers of compressible materials with varying indixes of refraction; and applying a force to the diffraction material using a transducer such to control a refraction angle with respect to the received EM radiation.

Example 24

The method of example 17, wherein amplitude modulating comprises:
receiving the EM radiation through a chamber;
absorbing the EM radiation using an absorptive material in the chamber; and
varying the thickness of the absorptive material in the chamber using a transducer.

Example 25

The method of example 17, wherein amplitude modulating comprises:
reflecting the EM radiation using a reflective element; and
adjusting an angle of reflection produced by the reflective to amplitude modulate the EM radiation.

Example 26

The method of example 17, wherein amplitude modulating comprises:
receiving the EM radiation along a radiation path; and
axially displacing a shutter to interrupt at least part of the EM radiation received along the radiation path using a transducer coupled to the shutter.

Example 27

A modulator for modulating electromagnetic (EM) radiation in a terahertz frequency band from about 0.1 terahertz to about 10 terahertz and locatable in a wellbore intersecting a subterranean earth formation, comprising a device configured to generate an amplitude modulated signal with the EM radiation.

Example 28

The modulator of example 27, wherein the device comprises a metamaterial configured to receive the EM radiation and comprising:
a substrate material; and
a conductive material configured in a split-ring resonator pattern on the substrate material with a resonant frequency in the terahertz frequency band.

Example 29

The modulator of example 28, wherein the metamaterial is configured to amplitude modulate the electromagnetic radiation in the terahertz frequency band by adjusting a charge carrier density in the substrate material.

Example 30

The modulator of example 28, wherein the metamaterial includes a diode formed from the substrate material and the conductive material, and the metamaterial is configured to amplitude modulate the electromagnetic radiation by changing a bias voltage applied to the diode.

Example 31

The modulator of example 27, wherein the devices comprises a semiconductor with a quantum well configured to amplitude modulate the electromagnetic radiation by adjusting a bias voltage applied to the semiconductor to change a charge carrier density in the quantum well.

Example 32

The modulator of example 27, wherein the device comprises:
a diffraction material configured to receive the electromagnetic radiation; and
a transducer coupled to the diffraction material and configured to generate an acoustic wave in the diffraction material such that the acoustic wave produces shifting indexes of refraction in the diffraction material to control a refraction angle with respect to the received EM radiation.

Example 33

The modulator of example 27, wherein the device comprises:
a diffraction material configured to receive the electromagnetic radiation and comprising layers of compressible materials with varying indixes of refraction; and
a transducer coupled to the diffraction material and configured to compress or apply tension to the diffraction material to control a refraction angle with respect to the EM radiation received.

Example 34

The modulator of example 27, wherein the device comprises:
a chamber configured to receive the EM radiation;
an absorptive material in the chamber and configured to absorb electromagnetic radiation in the terahertz frequency band; and
a transducer coupled to the chamber and configured to vary the thickness of the absorptive material in the chamber to amplitude modulate the EM radiation received.

Example 35

The modulator of example 27, wherein the device comprises:
a reflective element configured to reflect the EM radiation; and
a transducer coupled to the reflective element and configured to adjust an angle of reflection produced by the reflective element when the EM radiation is incident to the reflective element to amplitude modulate the EM radiation.

Example 36

The modulator of example 27, wherein the device comprises:
a shutter;

a radiation path in communication with the transmitter for receiving the EM radiation; and a transducer coupled to the shutter and configured to axially displace the shutter to interrupt at least part of the EM radiation received along the radiation path such that axially displacement amplitude modulates the EM radiation.

This discussion is directed to various embodiments. The drawing figures are not necessarily to scale. Certain features of the embodiments may be shown exaggerated in scale or in somewhat schematic form and some details of conventional elements may not be shown in the interest of clarity and conciseness. Although one or more of these embodiments may be preferred, the embodiments disclosed should not be interpreted, or otherwise used, as limiting the scope of the disclosure, including the claims. It is to be fully recognized that the different teachings of the embodiments discussed may be employed separately or in any suitable combination to produce desired results. In addition, one skilled in the art will understand that the description has broad application, and the discussion of any embodiment is meant only to be exemplary of that embodiment, and not intended to suggest that the scope of the disclosure, including the claims, is limited to that embodiment.

Certain terms are used throughout the description and claims to refer to particular features or components. As one skilled in the art will appreciate, different persons may refer to the same feature or component by different names. This document does not intend to distinguish between components or features that differ in name but not function, unless specifically stated. In the discussion and in the claims, the terms "including" and "comprising" are used in an open-ended fashion, and thus should be interpreted to mean "including, but not limited to . . . ." Also, the term "couple" or "couples" is intended to mean either an indirect or direct connection. In addition, the terms "axial" and "axially" generally mean along or parallel to a central axis (e.g., central axis of a body or a port), while the terms "radial" and "radially" generally mean perpendicular to the central axis. The use of "top," "bottom," "above," "below," and variations of these terms is made for convenience, but does not require any particular orientation of the components.

Reference throughout this specification to "one embodiment," "an embodiment," or similar language means that a particular feature, structure, or characteristic described in connection with the embodiment may be included in at least one embodiment of the present disclosure. Thus, appearances of the phrases "in one embodiment," "in an embodiment," and similar language throughout this specification may, but do not necessarily, all refer to the same embodiment.

Although the present disclosure has been described with respect to specific details, it is not intended that such details should be regarded as limitations on the scope of the disclosure, except to the extent that they are included in the accompanying claims.

What is claimed is:

1. A telemetry system for communication within a wellbore intersecting a subterranean earth formation, comprising:
   a transmitter configured to generate electromagnetic (EM) radiation in a terahertz frequency band from about 0.1 terahertz to about 10 terahertz; and
   a telemetry module locatable in the wellbore and comprising a modulator in communication with the transmitter and configured to receive the EM radiation and generate an amplitude modulated signal with the EM radiation in the terahertz frequency band; and
   a receiver locatable at the surface, the receiver configured to receive the amplitude modulated signal from the telemetry module.

2. The system of claim 1, further comprising:
   a waveguide in communication with the transmitter and the modulator and configured to propagate the EM radiation from the transmitter;
   a bottomhole assembly including the telemetry module, wherein the bottomhole assembly is locatable in the wellbore via a drill string including the waveguide;
   wherein the modulator is configured to transmit the signal with the EM radiation through the waveguide and to reflect the signal with the EM radiation through the waveguide.

3. The system of claim 1, wherein the modulator comprises a metamaterial configured to receive the EM radiation and comprising:
   a substrate material; and
   a conductive material configured in a split-ring resonator pattern on the substrate material with a resonant frequency in the terahertz frequency band.

4. The system of claim 3, wherein the metamaterial is configured to amplitude modulate the electromagnetic radiation in the terahertz frequency band by adjusting a charge carrier density in the substrate material.

5. The system of claim 3, wherein the metamaterial includes a diode formed from the substrate material and the conductive material, and the metamaterial is configured to amplitude modulate the electromagnetic radiation by changing a bias voltage applied to the diode.

6. The system of claim 1, wherein the modulator comprises a semiconductor with a quantum well configured to amplitude modulate the electromagnetic radiation by adjusting a bias voltage applied to the semiconductor to change a charge carrier density in the quantum well.

7. The system of claim 1, wherein the modulator comprises:
   a diffraction material configured to receive the electromagnetic radiation; and
   a transducer coupled to the diffraction material and configured to generate an acoustic wave in the diffraction material such that the acoustic wave produces shifting indexes of refraction in the diffraction material to control a refraction angle with respect to the received EM radiation;
   wherein the diffraction material comprises at least one of a crystal, a solid, and a fluid.

8. The system of claim 1, wherein the modulator comprises:
   a diffraction material configured to receive the electromagnetic radiation and comprising layers of compressible materials with varying indices of refraction; and
   a transducer coupled to the diffraction material and configured to compress or apply tension to the diffraction material to control a refraction angle with respect to the EM radiation received; or
   a chamber configured to receive the EM radiation;
   an absorptive material in the chamber and configured to absorb electromagnetic radiation in the terahertz frequency band; or
   a transducer coupled to the chamber and configured to vary the thickness of the absorptive material in the chamber to amplitude modulate the EM radiation received; or a reflective element configured to reflect the EM radiation; and a transducer coupled to the reflective element and configured to adjust an angle of reflection produced by the reflective element when the EM radiation is incident to the reflective element to amplitude modulate the EM radiation; or a shutter;

a radiation path in communication with the transmitter for receiving the EM radiation; and a transducer coupled to the shutter and configured to axially displace the shutter to interrupt at least part of the EM radiation received along the radiation path such that axially displacement amplitude modulates the EM radiation.

9. The system of claim 2, further comprising:

a second waveguide in communication with the receiver and the modulator; and wherein the waveguide is configured to communicate the EM radiation to the modulator and the second waveguide is configured to communicate the modulated signal from the modulator to the receiver.

10. A method for modulating electromagnetic radiation in a terahertz frequency band from about 0.1 terahertz to about 10 terahertz in a wellbore intersecting a subterranean formation, comprising:

transmitting the electromagnetic radiation in the terahertz frequency band through a waveguide using a transmitter to a telemetry module located within the wellbore; and amplitude modulating the electromagnetic radiation using a modulator of the telemetry module; and transmitting the amplitude modulated electromagnetic radiation from the telemetry module to a receiver located at the surface.

11. The method of claim 10, wherein amplitude modulating comprises receiving the EM radiation on a metamaterial, wherein the metamaterial comprises a substrate material and a conductive material configures in a split-ring resonator pattern on the substrate material with a resonant frequency in the terahertz frequency band.

12. The method of claim 11, where amplitude modulating further comprises adjusting a charge carrier density in the substrate material or changing a bias voltage applied to a diode formed from the substrate material and the conductive material.

13. The method of claim 10, wherein amplitude modulating comprises:

receiving the EM radiation on a semiconductor with a quantum well; and adjusting a bias voltage applied to the semiconductor to change a charge carrier density in the quantum well; or receiving the EM radiation on a diffraction material;

generating an acoustic wave in the diffraction material using a transducer such that the acoustic wave produces shifting indexes of refraction in the diffraction material to control a refraction angle with respect to the received EM radiation; or receiving the EM radiation on a diffraction material comprising layers of compressible materials with varying indixes of refraction; and applying a force to the diffraction material using a transducer such to control a refraction angle with respect to the received EM radiation.

14. The method of claim 10, wherein amplitude modulating comprises:

receiving the EM radiation through a chamber;

absorbing the EM radiation using an absorptive material in the chamber; and varying the thickness of the absorptive material in the chamber using a transducer; or reflecting the EM radiation using a reflective element; and adjusting an angle of reflection produced by the reflective to amplitude modulate the EM radiation; or receiving the EM radiation along a radiation path; and axially displacing a shutter to interrupt at least part of the EM radiation received along the radiation path using a transducer coupled to the shutter.

15. A telemetry module locatable within a wellbore intersecting a subterranean earth formation to facilitate communication within the wellbore, the telemetry module comprising a modulator for receiving electromagnetic (EM) radiation in a terahertz frequency band from about 0.1 terahertz to about 10 terahertz, modulate the EM radiation and transmit the modulated EM radiation uphole.

16. The telemetry module of claim 15, wherein the modulator comprises a metamaterial configured to receive the EM radiation and comprising:

a substrate material; and a conductive material configured in a split-ring resonator pattern on the substrate material with a resonant frequency in the terahertz frequency band.

17. The telemetry module of claim 16, wherein the metamaterial is configured to amplitude modulate the electromagnetic radiation in the terahertz frequency band by adjusting a charge carrier density in the substrate material.

18. The telemetry module of claim 16, wherein the metamaterial includes a diode formed from the substrate material and the conductive material, and the metamaterial is configured to amplitude modulate the electromagnetic radiation by changing a bias voltage applied to the diode.

19. The telemetry module of claim 15, wherein the modulator comprises a semiconductor with a quantum well configured to amplitude modulate the electromagnetic radiation by adjusting a bias voltage applied to the semiconductor to change a charge carrier density in the quantum well.

20. The telemetry module of claim 15, wherein the modulator comprises:

a diffraction material configured to receive the electromagnetic radiation; and a transducer coupled to the diffraction material and configured to generate an acoustic wave in the diffraction material such that the acoustic wave produces shifting indexes of refraction in the diffraction material to control a refraction angle with respect to the received EM radiation.

21. The telemetry module of claim 15, wherein the modulator comprises:

a diffraction material configured to receive the electromagnetic radiation and comprising layers of compressible materials with varying indixes of refraction; and a transducer coupled to the diffraction material and configured to compress or apply tension to the diffraction material to control a refraction angle with respect to the EM radiation received.

22. The telemetry module of claim 15, wherein the modulator comprises:

a chamber configured to receive the EM radiation;

an absorptive material in the chamber and configured to absorb electromagnetic radiation in the terahertz frequency band; and a transducer coupled to the chamber and configured to vary the thickness of the absorptive material in the chamber to amplitude modulate the EM radiation received.

23. The telemetry module of claim 15, wherein the modulator comprises:
   a reflective element configured to reflect the EM radiation; and
   a transducer coupled to the reflective element and configured to adjust an angle of reflection produced by the reflective element when the EM radiation is incident to the reflective element to amplitude modulate the EM radiation.

24. The telemetry module of claim 15, wherein the modulator comprises:
   a shutter;
   a radiation path in communication with a transmitter for receiving the EM radiation; and
   a transducer coupled to the shutter and configured to axially displace the shutter to interrupt at least part of the EM radiation received along the radiation path such that axially displacement amplitude modulates the EM radiation.

* * * * *